United States Patent
Zhao et al.

(10) Patent No.: US 12,457,687 B2
(45) Date of Patent: Oct. 28, 2025

(54) STACKED COMPONENT ARRAY STRUCTURE

(71) Applicant: Tesla, Inc., Austin, TX (US)

(72) Inventors: Jin Zhao, San Jose, CA (US); Satyan Chandra, Mountain View, CA (US); Shishuang Sun, San Jose, CA (US)

(73) Assignee: Tesla, Inc., Austin, TX (US)

( * ) Notice: Subject to any disclaimer, the term of this patent is extended or adjusted under 35 U.S.C. 154(b) by 109 days.

(21) Appl. No.: 18/255,853

(22) PCT Filed: Dec. 14, 2021

(86) PCT No.: PCT/US2021/072923
§ 371 (c)(1),
(2) Date: Jun. 2, 2023

(87) PCT Pub. No.: WO2022/133448
PCT Pub. Date: Jun. 23, 2022

(65) Prior Publication Data
US 2024/0015887 A1   Jan. 11, 2024

Related U.S. Application Data

(60) Provisional application No. 63/127,018, filed on Dec. 17, 2020.

(51) Int. Cl.
  *H05K 1/11*   (2006.01)
  *H05K 3/32*   (2006.01)
  *H05K 3/34*   (2006.01)

(52) U.S. Cl.
  CPC ............. *H05K 1/113* (2013.01); *H05K 3/328* (2013.01); *H05K 3/3436* (2013.01);
  (Continued)

(58) Field of Classification Search
  CPC ...... H05K 1/113; H05K 3/328; H05K 3/3436; H05K 3/3442; H05K 2201/10015; H05K 2201/10636; H05K 2201/10734
  (Continued)

(56) References Cited

U.S. PATENT DOCUMENTS 10,887,982 B2   1/2021   Nasr et al.
11,122,678 B2   9/2021   Krithivasan et al.
(Continued)

FOREIGN PATENT DOCUMENTS

KR   10-2004-0101684   12/2004
TW   201801588   1/2018
(Continued)

OTHER PUBLICATIONS

International Search Report and Written Opinion dated Apr. 14, 2022 in application No. PCT/US2021/072923.

*Primary Examiner* — Andargie M Aychillhum
(74) *Attorney, Agent, or Firm* — Knobbe, Martens, Olson & Bear, LLP

(57) ABSTRACT

A structure with an electronic component array positioned between two stacked printed circuit boards (600,606) is disclosed. The electronic components (502) of the array can be connected to the printed circuit board (600,606) by way of solder connections. Example electronic components (502) include capacitors. Related methods of manufacture are disclosed that involve applying heat to a solder paste array on a printed circuit board (600,606) to form solid conductors electrically connected to the electronic components (502).

18 Claims, 14 Drawing Sheets

(52) U.S. Cl.
CPC . *H05K 3/3442* (2013.01); *H05K 2201/10015* (2013.01); *H05K 2201/10636* (2013.01); *H05K 2201/10734* (2013.01); *H05K 2203/101* (2013.01); *H05K 2203/107* (2013.01)

(58) Field of Classification Search
USPC .......................................................... 174/250
See application file for complete search history.

(56) References Cited

U.S. PATENT DOCUMENTS

| | | | |
|---|---|---|---|
| 11,367,680 | B2 | 6/2022 | Pang et al. |
| 11,570,889 | B2 | 1/2023 | Nasr et al. |
| 2003/0015574 | A1 | 1/2003 | Teshima et al. |
| 2006/0245308 | A1* | 11/2006 | Macropoulos ...... H01L 23/3677 |
| | | | 257/E23.068 |
| 2009/0052142 | A1* | 2/2009 | Brewer .................. H05K 1/144 |
| | | | 29/829 |
| 2011/0227795 | A1* | 9/2011 | Lopez .................... H01Q 1/243 |
| | | | 343/700 MS |
| 2015/0366063 | A1* | 12/2015 | Takagi .............. H01L 23/49811 |
| | | | 29/831 |
| 2020/0111597 | A1* | 4/2020 | Xiong .................... H05K 1/111 |
| 2020/0266705 | A1 | 8/2020 | Sun et al. |
| 2020/0303127 | A1 | 9/2020 | Cain |
| 2021/0351104 | A1 | 11/2021 | Cao et al. |
| 2022/0051994 | A1 | 2/2022 | Pang et al. |

FOREIGN PATENT DOCUMENTS

| | | |
|---|---|---|
| TW | 201840256 | 11/2018 |
| TW | 202015500 | 4/2020 |
| WO | WO 2020/063681 | 4/2020 |

\* cited by examiner

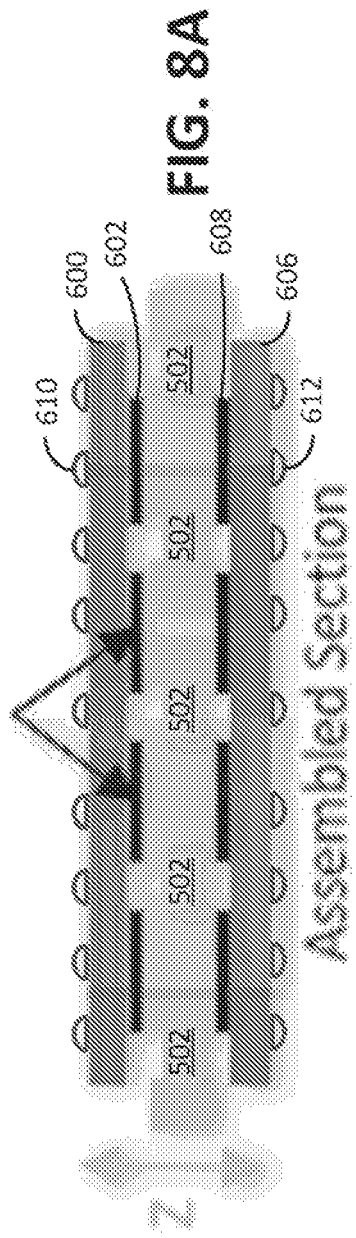
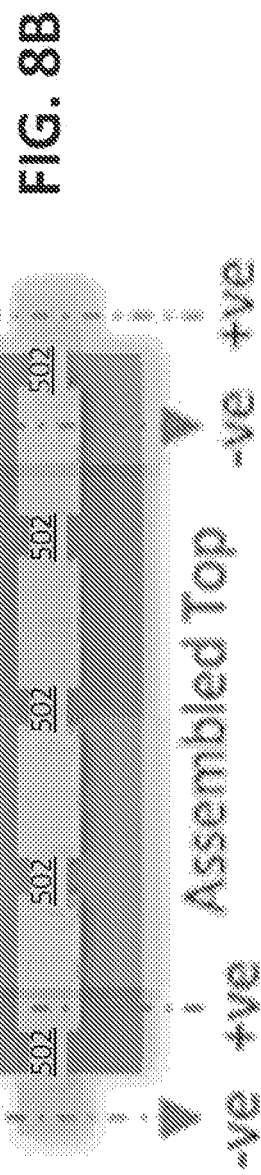

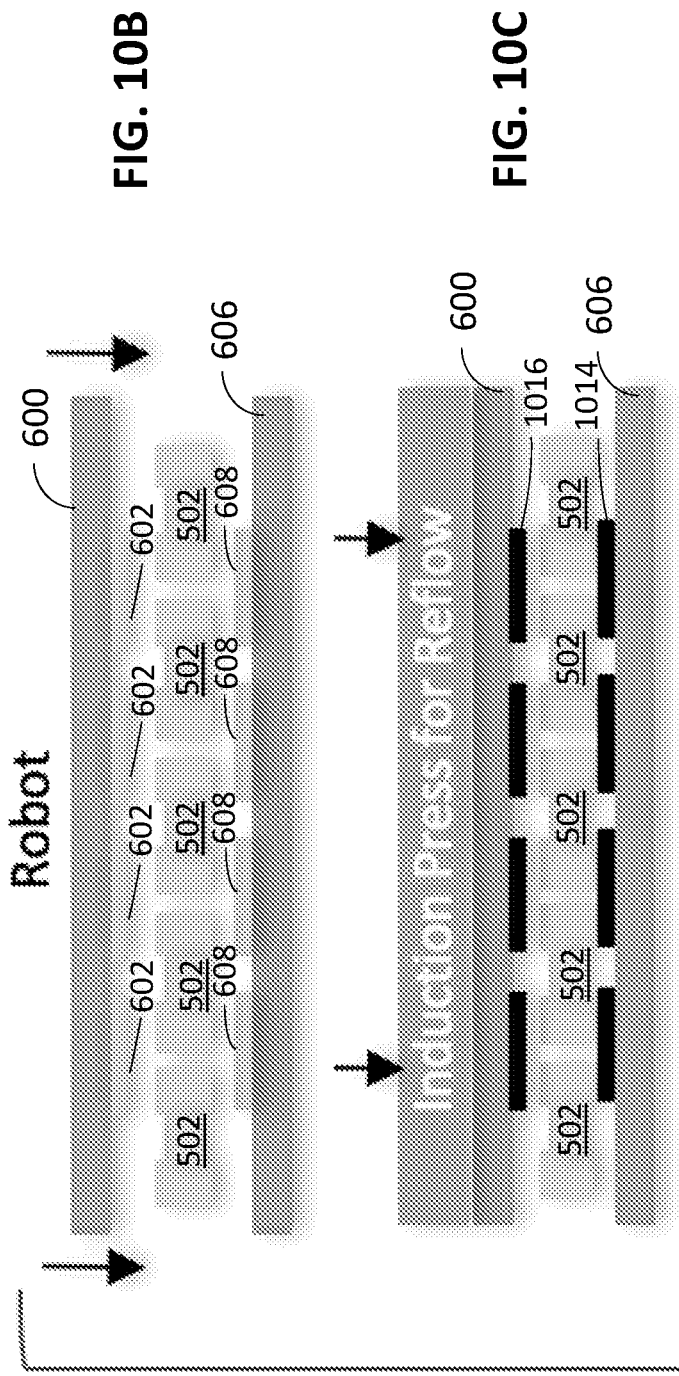

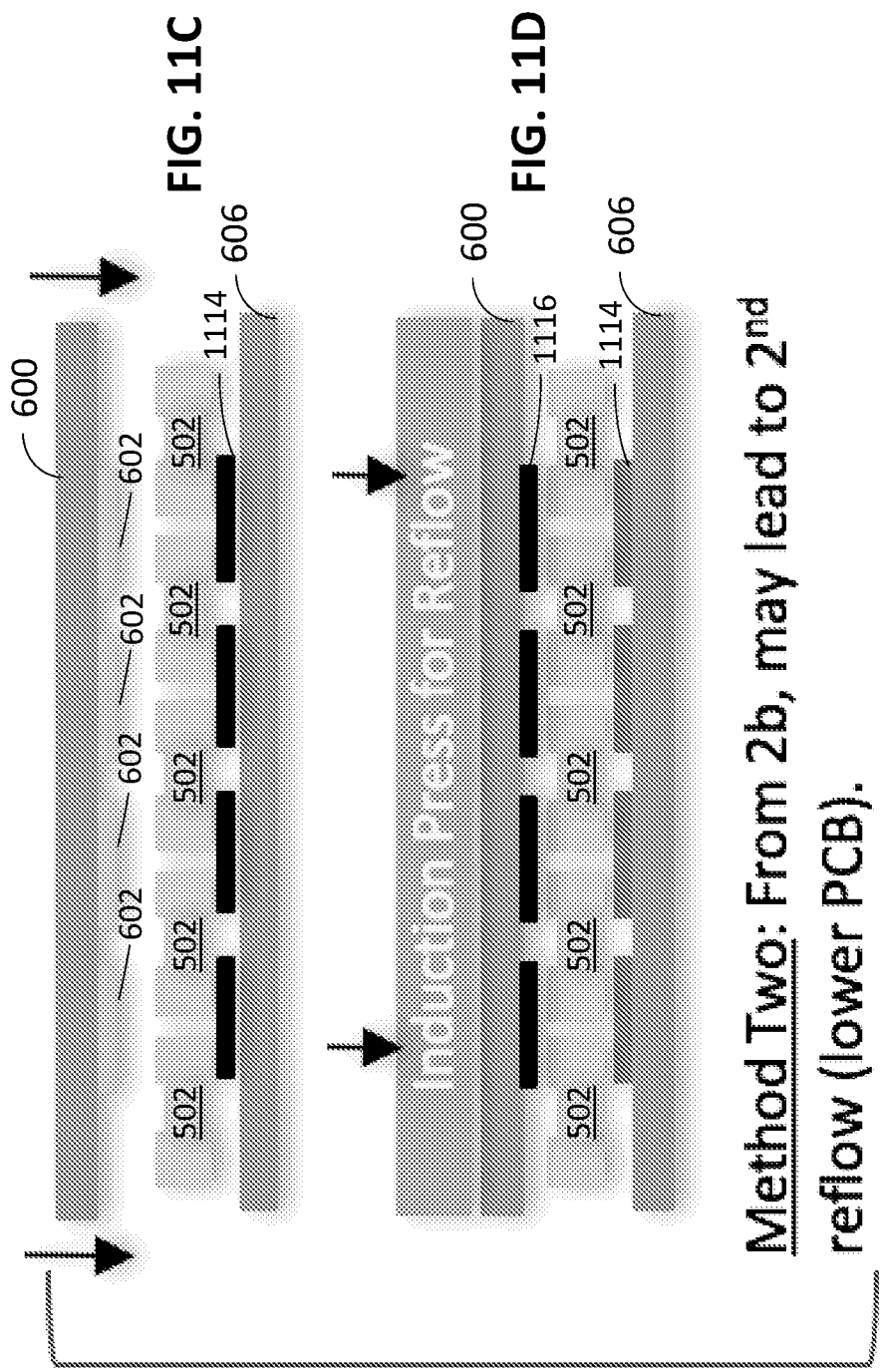

STACKED COMPONENT ARRAY STRUCTURE

CROSS REFERENCE TO PRIORITY APPLICATION

This application is a U.S. national phase application under 35 U.S.C. § 371 of International Application No. PCT/US2021/072923, filed on Dec. 14, 2021, which claims priority to U.S. Prov. App. No. 63/127,018, titled "STACKED PCBS PASSIVE/ACTIVE COMPONENTS ARRAY STRUCTURE" and filed on Dec. 17, 2020, the disclosures of each of which are hereby incorporated herein by reference in their entireties and for all purposes.

BACKGROUND

Technical Field

The present disclosure relates generally to electronics, and more specifically to passive (such as capacitors, inductors, resistors and their combination) and/or active (such as integrated circuit chips) components in the format of arrays of electronic devices.

Description of Related Technology

Switching power supplies are generally known. One application of a switching power supply is to convert an input voltage, e.g., input DC voltage to a lower DC voltage to drive an Integrated Circuit (IC). A Voltage Regulator Module (VRM) may be used to convert a voltage received from a battery or other DC source to a lower voltage for use by the IC. The requirement of high power for the ICs, e.g., in excess of 500 watts, at relatively low voltages, e.g., less than one volt, creates problems for the VRM. The VRM must supply a relatively low DC voltage at many hundreds of amperes. Typically, VRMs are space constrained but still include components (such as LC filter) to produce clean power at a low voltage and with high current.

The VRMs typically require substantial capacitance to condition their output DC voltage. It is difficult to include this substantial capacitance in a small form factor device, e.g., small foot print. Prior capacitor arrays typically required a relatively large foot print, which limited the foot print size of the VRM. This shortcoming of prior capacitor arrays introduced similar problems with other electronics that had both a high capacitance requirement and a small footprint requirement.

SUMMARY

The innovations described in the claims each have several aspects, no single one of which is solely responsible for its desirable attributes. Without limiting the scope of the claims, some prominent features of this disclosure will now be briefly described.

One aspect of this disclosure is a stacked Printed Circuit Board (PCB) electronic component array structure comprising a first PCB, a second PCB stacked with the first PCB, and an electronic component array comprising a plurality of electronic components positioned between the first PCB and the second PCB. The plurality of electronic components are electrically coupled to the first PCB by way of a first solder connections. The plurality of electronic components are electrically coupled to the second PCB by way of second solder connections.

First sides of the plurality of electronic components can electrically couple to both the first PCB and the second PCB, and second sides of the plurality of electronic components electrically couple to both the first PCB and the second PCB. An inner surface of the first PCB can couple to the plurality of electronic components of the electronic components array, and an inner surface of the second PCB can couple to the plurality of electronic components of the electronic components array. The structure can include a first ball grid array disposed on an outer surface of the first PCB, where the plurality of electronic components are electrically coupled to the first ball grid array by way of first vias in the first PCB; and a second ball grid array disposed on an outer surface of the second PCB, where the plurality of electronic components are electrically coupled to second first ball grid array by way of second vias in the second PCB.

The plurality of electronic components comprise a plurality of discrete passive elements. The plurality of discrete passive elements can comprise a first group of discrete passive elements electrically connected in series with each other and a second group of discrete passive elements electrically connected in parallel with each other. The plurality of electronic components can comprise a plurality of capacitors. The plurality of electronic components can comprise a plurality of active components.

Another aspect of this disclosure is a stacked Printed Circuit Board (PCB) capacitor array structure that includes a lower PCB, an upper PCB, and a capacitor array having a plurality of capacitors residing between the lower PCB and the upper PCB and electrically coupled to both the lower PCB and the upper PCB.

A first plurality of solder connections can electrically couple the plurality of capacitors of the capacitor array to the upper PCB, and a second plurality of solder connections can electrically couple the plurality of capacitors of the capacitor array to the lower PCB. First sides of the plurality of capacitors electrically can couple to both the upper PCB and the lower PCB, and second sides of the plurality of capacitors electrically couple to both the upper PCB and the lower PCB.

An inner surface of the upper PCB can couple to the plurality of capacitors of the capacitor array, and an inner surface of the lower PCB can couple to the plurality of capacitors of the capacitor array. The structure can include a first ball grid array disposed on an outer surface of the upper PCB, and a second ball grid array disposed on an outer surface of the lower PCB.

Another aspect of this disclosure is a method of assembling a stacked Printed Circuit Board (PCB) electronic component array. The method includes providing a first PCB having a first solder paste array thereon; positioning a plurality of electronic components of an electronic component array relative to a first PCB, wherein the first solder paste array on the first PCB corresponds to the electronic component array; positioning a second PCB relative to the plurality of electronic components such that a second solder paste array on the second PCB aligns with the plurality of electronic components; and applying heat to convert the second solder paste array to second solid conductors electrically connected to the plurality of electronic components, wherein the electronic components are electrically connected to first solid conductors on the first PCB and the second solid conductors of the second PCB after the applying heat to convert the second solder paste array.

The method can include applying the first solder paste array on the surface of the first PCB prior to the providing the first PCB. Applying heat to convert the second solder paste array to second solid conductors can also covert the first solder paste array to the first solid conductors. The method can include applying heat to convert the first solder paste array to the first solid conductors prior to the positioning the second PCB.

Applying heat to convert the first second paste array to second solid conductors can include an induction press reflow process. Applying heat to convert the second solder paste array to second solid conductors can include a laser welding process.

The plurality of electronic components can include discrete passive components. The discrete passive components can include a plurality of capacitors. The method can electrically connect a first group of electronic components of the plurality of electronic components in series with each other. The method can electrically connect a second group of electronic components of the plurality of electronic components in parallel with each other.

The method can electrically connect first sides of the plurality of electronic components to both the first PCB and the second PCB. The method can electrically connect second sides of the plurality of electronic components to both the first PCB and the second PCB.

Another aspect of this disclosure is a method for constructing a stacked Printed Circuit Board (PCB) capacitor array comprising: applying a first solder paste array to an inner surface of a lower PCB; placing a plurality of capacitors of a capacitor array onto the first solder paste array, wherein a pattern of the first solder paste array corresponds to the capacitor array; applying a second solder paste array to an inner surface of an upper PCB; placing the upper PCB onto the capacitor array so that the second solder paste array of the upper PCB aligns with the plurality of capacitors of the capacitor array; and applying heat to convert the first solder paste array and the second solder paste array to solid conductors.

Applying heat to convert the first solder paste array and the second solder paste array to solid conductors can include an induction press reflow process.

Applying heat to convert the first solder paste array and the second solder paste array to solid conductors can include a laser welding process.

Another aspect of this disclosure is a method for constructing a stacked Printed Circuit Board (PCB) capacitor array comprising: applying a first solder paste array to an inner surface of a lower PCB; placing a plurality of capacitors of a capacitor array onto the solder paste array, wherein a pattern of the solder paste array corresponds to the capacitor array; applying heat to convert the first solder paste array to solid conductors; applying a second solder paste array to an inner surface of an upper PCB; placing the upper PCB onto the capacitor array so that the second solder paste array of the upper PCB aligns with the plurality of capacitors of the capacitor array; and applying heat to convert the second solder paste array to solid conductors.

Applying heat to convert the first solder paste array and the second solder paste array to solid conductors can include an induction press reflow process.

Applying heat to convert the first solder paste array and the second solder paste array to solid conductors can include a laser welding process.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 8A is a sectional side view of constructed stacked PCB capacitor array structure according to the present disclosure.

FIG. 8B is a top view of a partially constructed stacked PCB capacitor array structure according to the present disclosure.

FIGS. 10B and 10C are sectional side views of the stacked PCB capacitor array structure during construction consistent with FIG. 10A.

FIGS. 11B, 11C, and 11D are sectional side views of the stacked PCB capacitor array structure during construction consistent with FIG. 11A.

DETAILED DESCRIPTION

Figure 1:
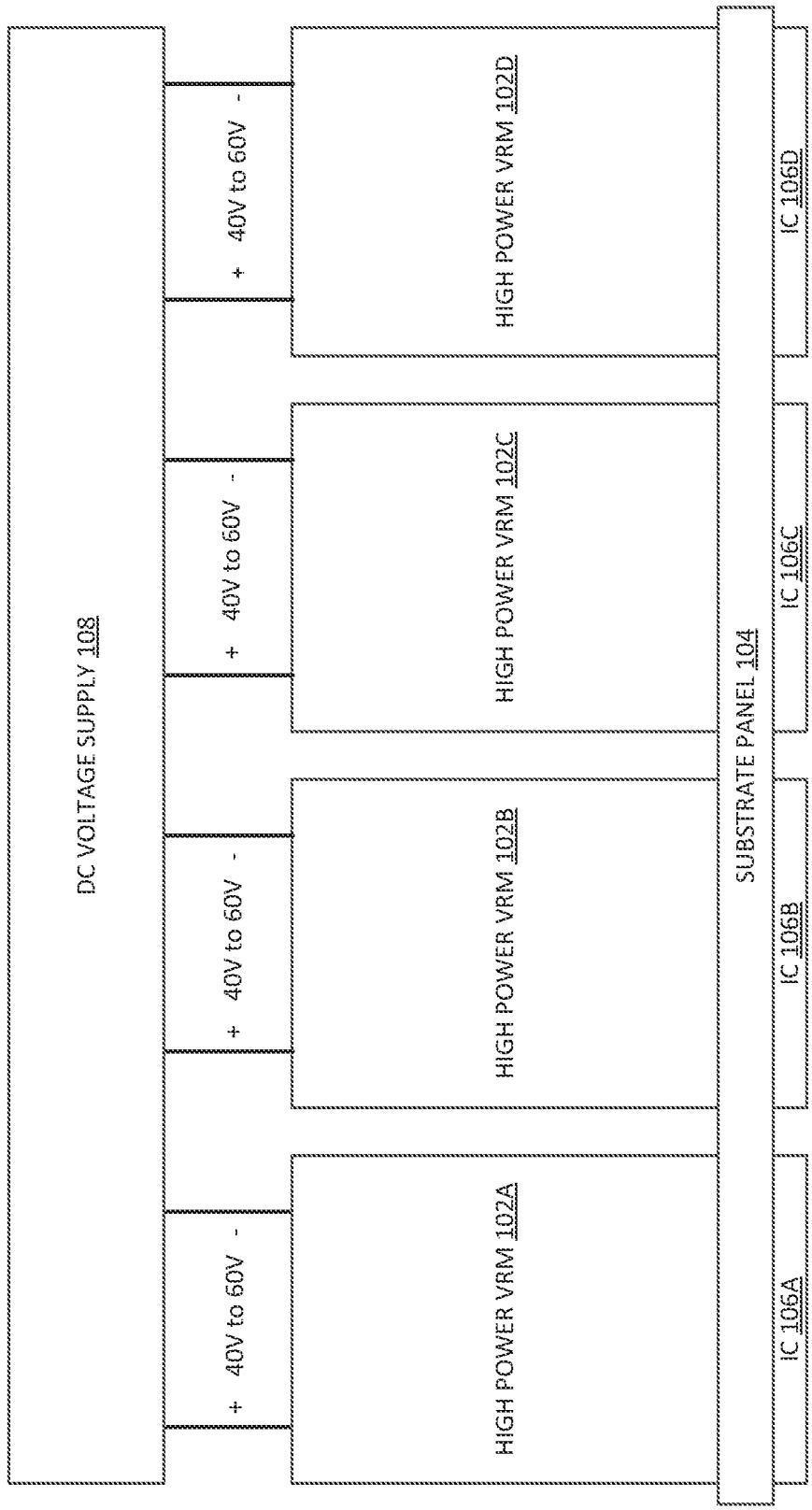
FIG. 1 is a block diagram illustrating a processing system that includes a plurality of multiple circuit board high power Voltage Regulator Modules (VRMs) constructed according to the present disclosure.

FIG. 1 is a block diagram illustrating a processing system that includes a plurality of multiple circuit board high power Voltage Regulator Modules (VRMs) constructed according to the present disclosure. The processing system 100 of FIG. 1 includes a plurality of multiple circuit board high power VRMs 102A, 102B, 102C, and 102D constructed according to the present disclosure that are mounted on a substrate panel 104. The plurality of multiple circuit board high power VRMs 102A, 102B, 102C, and 102D are fed by a DC supply voltage 108, e.g., 40 volts, 48 volts, or another relatively voltage, and respectively service a respective plurality of Integrated Circuits (ICs) 106A, 106B, 106C, and 106D. The DC supply voltage 108 can be in a range from 40 volts to 60 volts in certain applications. In some embodiments, each of the plurality of multiple circuit board high power VRMs 102A, 102B, 102C, and 102D produces an output of approximately 0.8 volts and provides 600 watts of power or more to the respective plurality of ICs 106A, 106B, 106C, and 106D. Thus, each of the plurality of multiple circuit board high power VRMs 102A, 102B, 102C, and 102D produces in excess of 100 amperes of current to the plurality of ICs 106A, 106B, 106C, and 106D.

Because each of the plurality of multiple circuit board high power VRMs 102A, 102B, 102C, and 102D produces an output of approximately 0.8 volts to the respective plurality of ICs 106A, 106B, 106C, and 106D and it is desirable for the footprint of the VRMs 102A-102D to be approximately the same as the footprints of the plurality of ICs 106A-106D, the footprint of the plurality of VRMs 102A-102D is limited. In some embodiments, the footprint is approximately 3 centimeters by 3 centimeters, 4 centimeters by 4 centimeters, or other relatively small dimensions that approximate the cross section of the plurality of ICs 106A, 106B, 106C, and 106D. However, in order to produce power at low voltage and high power, the plurality of VRMs 102A-102D typically include a relatively large number of discrete components.

Thus, according to the present disclosure, the plurality of multiple circuit board high power VRMs 102A, 102B, 102C, and 102D include circuit boards that are disposed in planes both parallel to the substrate panel 104 and in planes perpendicular to the substrate panel 104. One embodiment that will be described with reference to FIGS. 2, 3A, and 3B includes two circuit boards oriented perpendicular to the substrate panel 104 and two circuit boards oriented parallel to the substrate panel 104. With this structure, the VRMs 102A, 102B, 102C, and 102D extend above the substrate panel 104 in a direction perpendicular to the substrate panel. One or more of the VRMs 102A, 102B, 102C, and 102D can include and/or be implemented in association with any suitable principles and advantages discussed with reference to FIGS. 5 to 11D. For example, the VRM 102A can include a capacitor array soldered to and positioned between two stacked PCBs.

Figure 2:
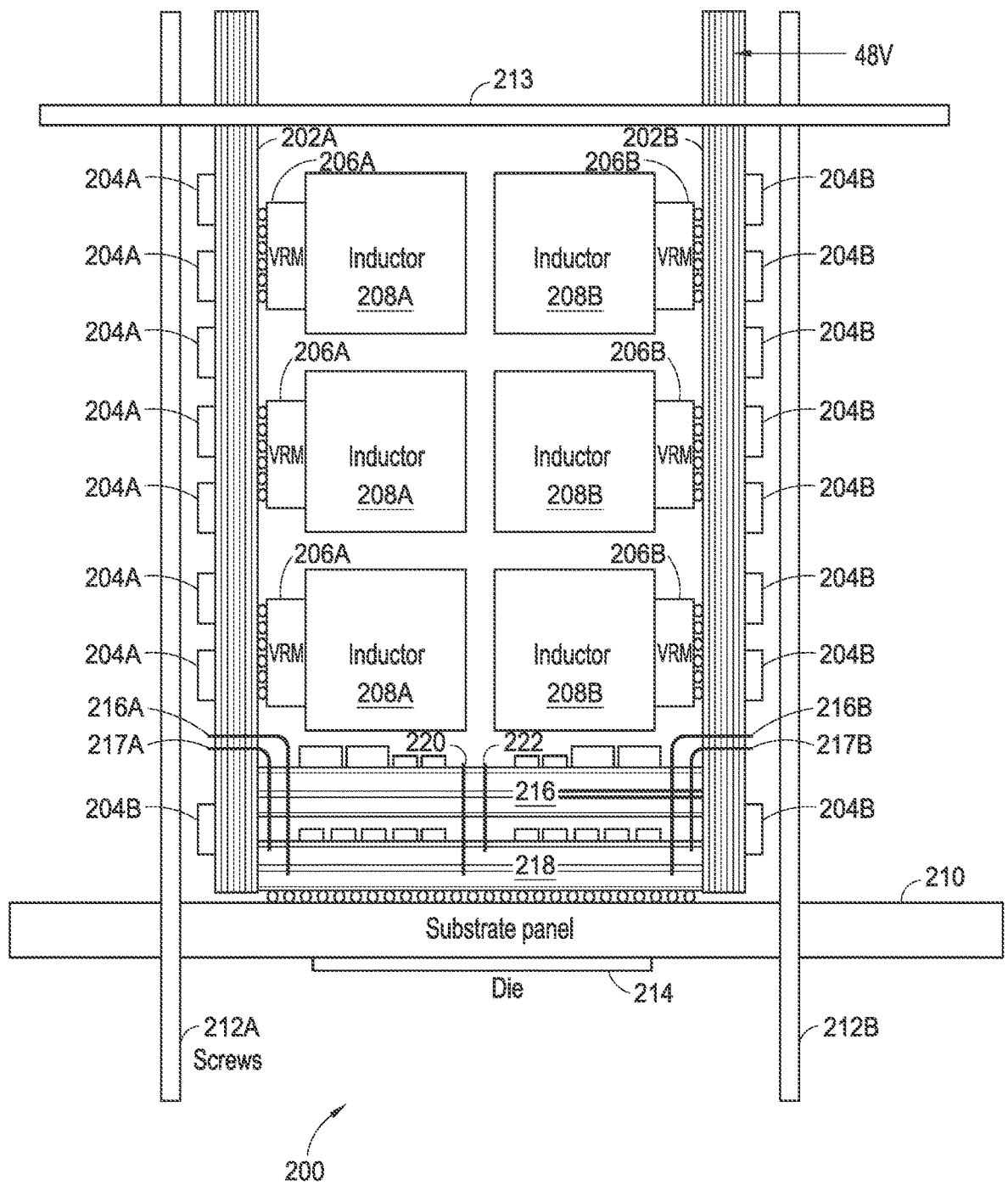
FIG. 2 is a block schematic diagram illustrating a multiple circuit board high power VRM according to the present disclosure.

FIG. 2 is a block schematic diagram illustrating a multiple circuit board high power VRM according to the present disclosure. The multiple circuit board high power VRM 200 includes a first voltage rail circuit board 202A, a second voltage rail circuit board 202B, a first capacitor circuit board 216, and a second capacitor circuit board 218. These components are mounted on rails 212A and 212B and on top brace 213, the rails 212A and 212B coupling to a substrate panel 210 using screws, for example. The second capacitor board 218 may couple to the substrate panel 210 via solder balls, which may have a pitch of 1 mm. The electrical connection formed by the substrate panel 210 couples a first rail voltage and a second rail voltage to die 214 mounted on an opposite side of the substrate panel 210.

The first voltage rail circuit board 202A is oriented in a first plane, has formed therein a first plurality of conductors (in a plurality of layers), and having mounted thereon a first plurality of VRM elements 206A, a first plurality of inductors 208A coupled to the first plurality of VRM elements 206A, and a first plurality of capacitors 204A. The first voltage rail circuit board 202A is configured to receive a first voltage and to produce the first rail voltage. The second voltage rail circuit board 202B is oriented in a second plane that is substantially parallel to the first plane, includes a second plurality of conductors formed therein (in a plurality of layers), and has mounted thereon a second plurality of VRM elements 206B, a second plurality of inductors 208B coupled to the second plurality of VRM elements 206B, and a second plurality of capacitors 204B. The second voltage rail circuit board 202B is configured to receive a second voltage and to produce the second rail voltage. The first and second voltages may be received from a battery pack within an electric vehicle.

The first capacitor circuit board 216 is oriented in a third plane that is substantially perpendicular to the first plane and has formed therein a third plurality of conductors. The first capacitor circuit board has mounted thereon a third plurality of capacitors. The second capacitor circuit board 218 is oriented in a fourth plane that is substantially parallel to the third plane and includes, has formed therein, a fourth plurality of conductors, and has mounted thereon a fourth plurality of capacitors.

The multiple circuit board high power VRM 200 further includes a fifth plurality of conductors 216A and 217A coupling the first voltage rail circuit board 202A to the first capacitor circuit board 216 and to the second capacitor circuit board 218. The multiple circuit board high power VRM 200 further includes a sixth plurality of conductors 216B and 217B coupling the second voltage rail circuit board 202B to the first capacitor circuit board 216 and to the second capacitor circuit board 216. The illustrated high power VRM further includes a seventh plurality of conductors 220 and 222 coupling the first capacitor circuit board 216 to the second capacitor circuit board 218.

Figure 3A:
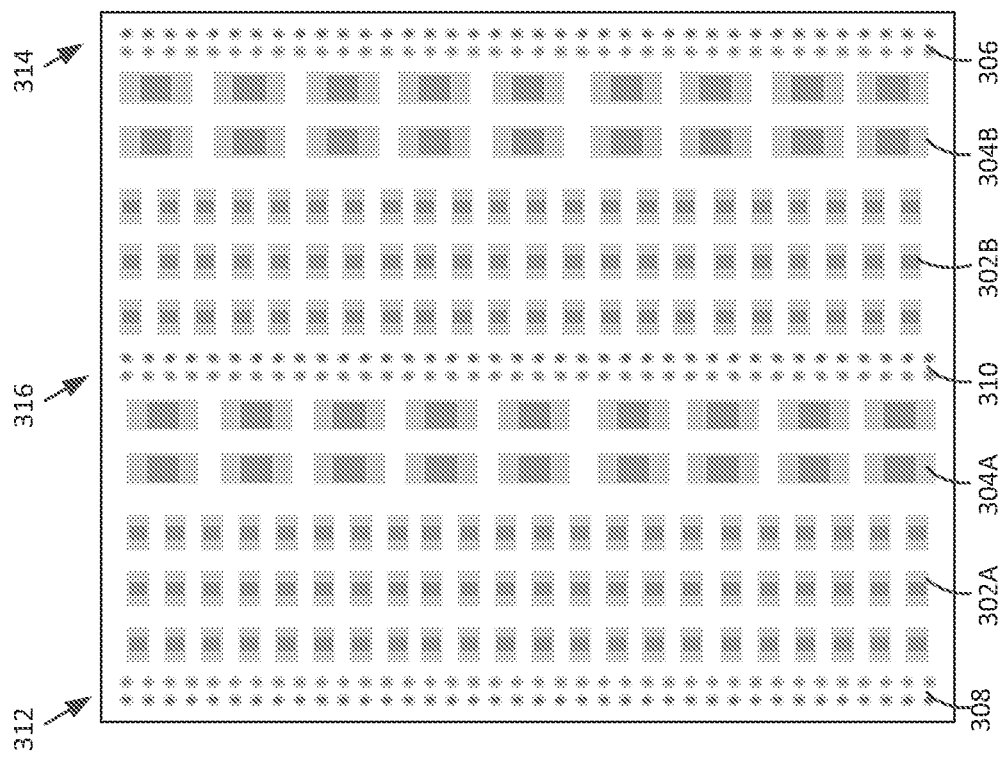
FIG. 3A is a block schematic diagram illustrating a first capacitor circuit board of the multiple circuit board high power VRM of FIG. 2.

FIG. 3A is a block schematic diagram illustrating a first capacitor circuit board of the multiple circuit board high power VRM of FIG. 2. The first capacitor circuit board 216 includes the third plurality of capacitors 302A, 304A, 302B, and 304B. Note that the capacitors 302A and 304A are located on a first side of the first capacitor circuit board 216 and that the capacitors 302B and 304B are located on a second side of the first capacitor circuit board 216. The fifth plurality of conductors 216A and 217A couple to connectors 308 of the first capacitor circuit board 216. Further, the sixth plurality of conductors 216B and 217B couple to connectors 306 of the first capacitor circuit board 216. The seventh plurality of conductors 220 and 222 couple to connectors 310 of the first capacitor circuit board 216.

Figure 3B:
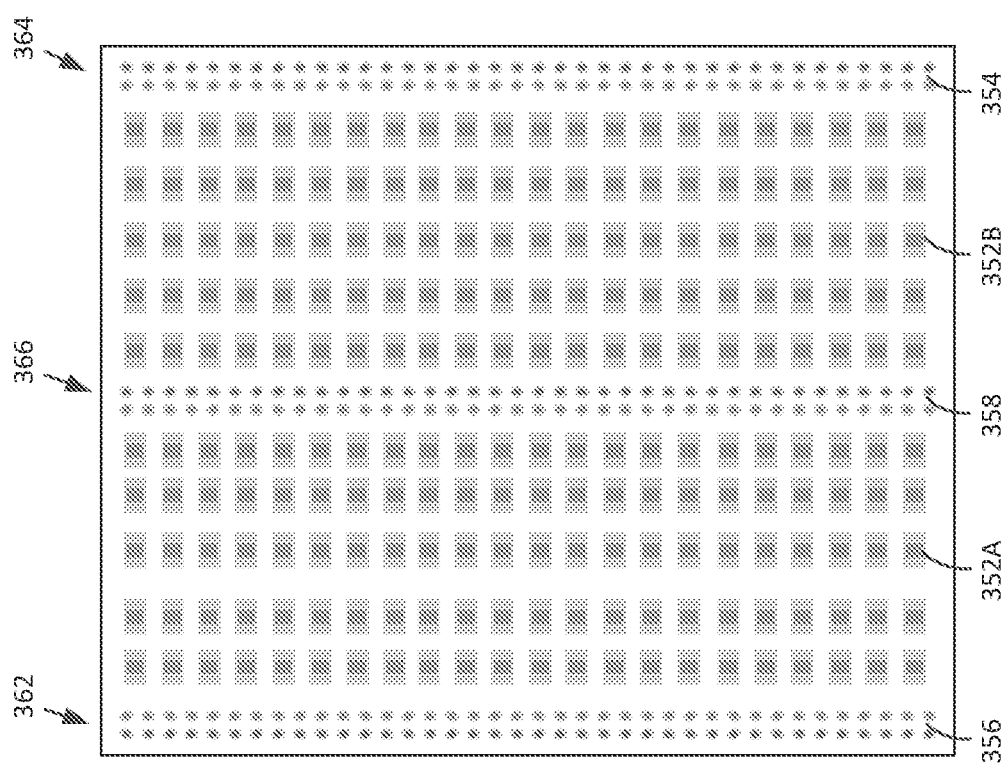
FIG. 3B is a block schematic diagram illustrating a second capacitor circuit board of the multiple circuit board high power VRM of FIG. 2.

FIG. 3B is a block schematic diagram illustrating a second capacitor circuit board of the multiple circuit board high power VRM of FIG. 2. The second capacitor circuit board 218 includes the fourth plurality of capacitors 352A, 354A, 352B, and 354B. Note that the capacitors 352A and 354A are located on a first side of the second capacitor circuit board 218 and that the capacitors 352B and 354B are located on a second side of the second capacitor circuit board 218. The fifth plurality of conductors 216A and 217A couple to connectors 356 of the second capacitor circuit board 218. Further, the sixth plurality of conductors 216B and 217B couple to connectors 354 of the second capacitor circuit board 218. The seventh plurality of conductors 220 and 222 couple to connectors 358 of the second capacitor circuit board 218.

Referring to both FIGS. 3A and 3B, the fifth plurality of conductors 216A and 217A couples to a first outer portion 312 of the first capacitor circuit board 216 and to a first outer portion 362 of the second capacitor circuit board 218. Further the sixth plurality of conductors 216B and 217B couples to a second outer portion 314 of the first capacitor circuit board 216 and to a second outer portion 364 of the second capacitor circuit board 218. Moreover, the seventh plurality of conductors 220 and 222 couples between a central portion 316 of the first capacitor circuit board 216 and a central portion 366 of the second capacitor circuit board 318.

Still referring to both FIGS. 3A and 3B, the third plurality of capacitors 302A, 304A, 302B, and 304B are configured to filter medium to low frequency components of the first rail voltage and the second rail voltage and the fourth plurality of capacitors 352A and 352B are configured to filter high frequency components of the first rail voltage and the second rail voltage.

With the embodiments of FIGS. 2, 3A and/or 3B, the input voltage received by the first voltage rail circuit board 202A and the second voltage rail circuit board 202B may be 40 voltages with 0.8-volt signals used for communications therewith.

Figure 4:
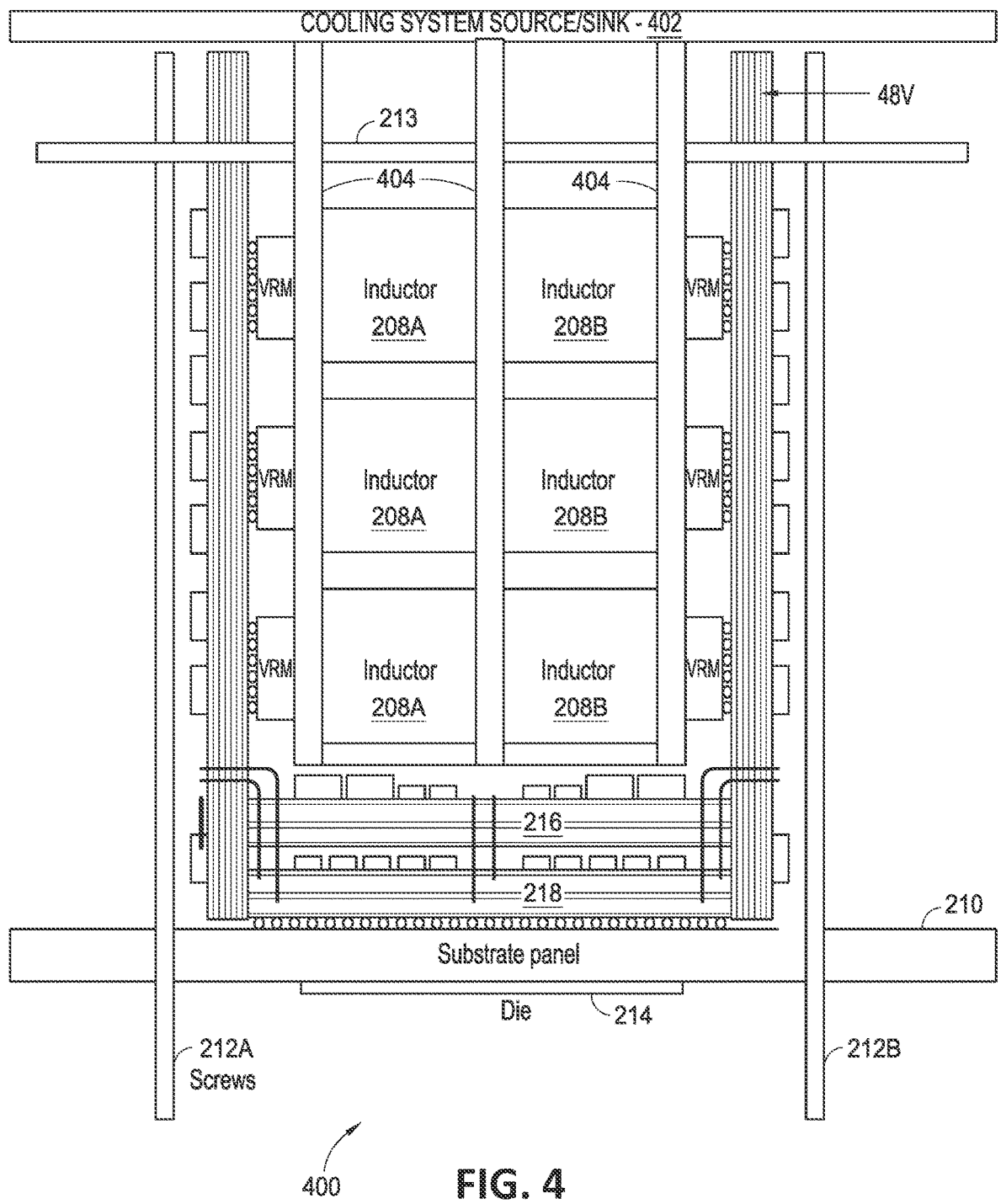
FIG. 4 is a block schematic diagram illustrating cooling system components of a multiple circuit board high power VRM according to the present disclosure.

FIG. 4 is a block schematic diagram illustrating cooling system components of a multiple circuit board high power VRM according to the present disclosure. The difference between the embodiment 200 of FIG. 2 and the embodiment 400 of FIG. 4 is the inclusion of the cooling system components. The first plurality of VRM elements 206A, the first plurality of inductors 208A, the second plurality of VRM elements 206B, the second plurality of inductors 208B produce significant heat in their operation. Thus, the multiple circuit board high power VRM includes a cooling system to cool these components. A cooling system source/sink 402 couples to piping 404 to service the flow of coolant to cool the VRM elements 206A/206B and the inductors 208A/208B. The piping 404 may include many segments. The piping 404 may couple directly to the VRM elements 206A/206B and the inductors 208A/208B or be thermally coupled thereto by intermediate structures. The cooling system source/sink 402 may service multiple circuit board high power VRMs as were illustrated in FIG. 1.

Figure 5:
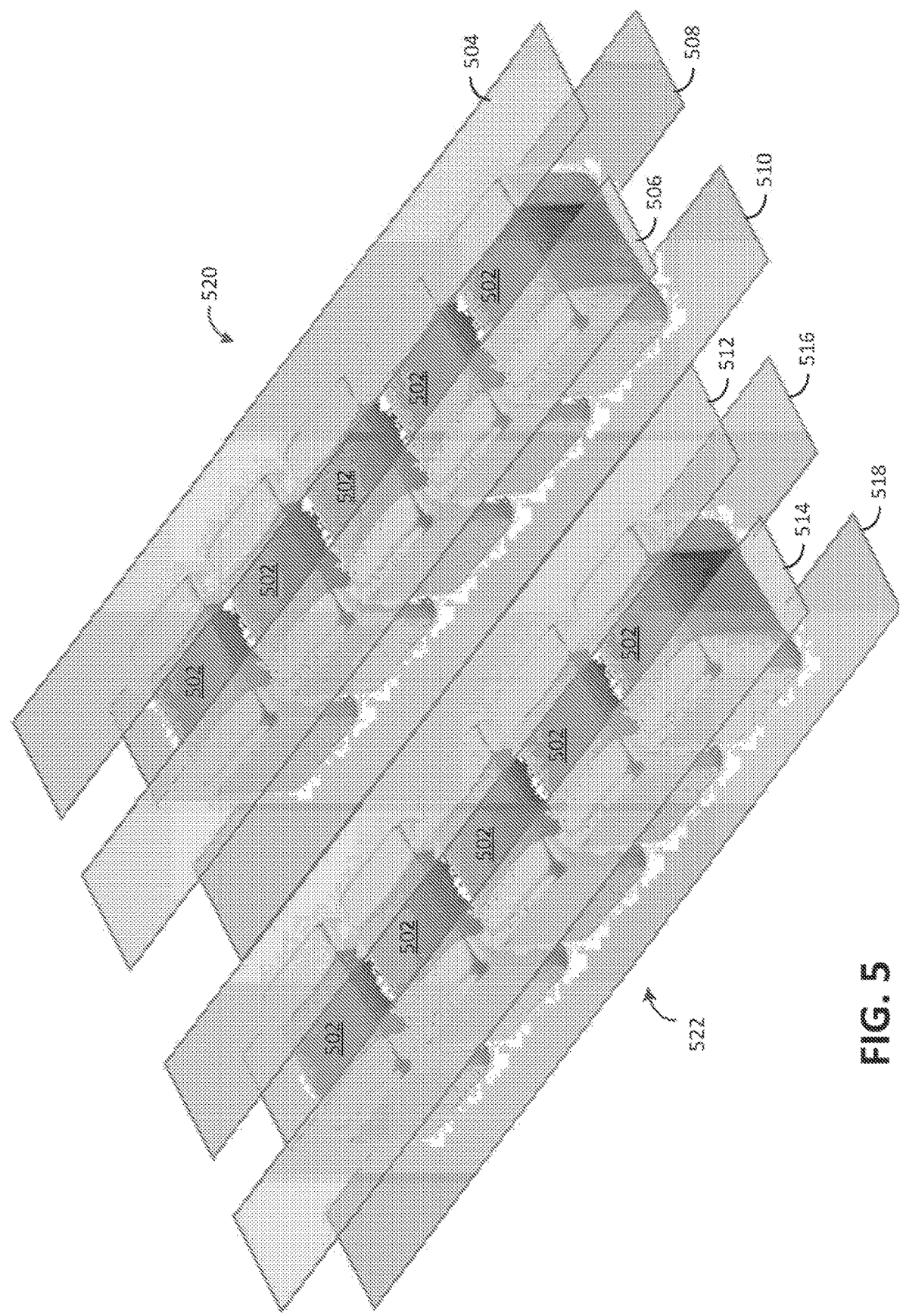
FIG. 5 is a transparent perspective view of a capacitor array intercoupled by conductive structures according to the present disclosure.

FIG. 5 is a transparent perspective view of a capacitor array intercoupled by conductive structures according to the present disclosure. The view of FIG. 5 is a portion of a larger capacitor array that includes capacitors 502 that extend in a plane in two dimensions, an x dimension and a y dimension. The capacitors 502 are discrete elements organized essentially in an x-y plane. Each capacitor 502 has a first side and a second side residing in the x-y plane. The capacitors 502 can be surface mount technology (SMT) capacitors in certain applications. Also shown in FIG. 5 are conductive strips 504, 506, 508, 510, 512, 514, 516, and 518. Shown are a first group of capacitors 520 and a second group of capacitors 522. Conductive strips 504 and 508 electrically couple first sides of the first group of capacitors 520 and conductive strips 506 and 510 electrically couple second sides of the first group of capacitors 520. Likewise, Conductive strips 512 and 516 electrically couple first sides of the second group of capacitors 522 and conductive strips 514 and 518 electrically couple second sides of the second group of capacitors 522. The conductive strips 504-506 may hold the capacitors 502 in position in an array format in addition to providing an electrical connection. In other embodiments, non-conductive strips may serve only to hold the capacitors 502 in place prior to their assembly with sandwiching PCBs and, in such case, do not serve as electrical connection(s).

Figure 6:
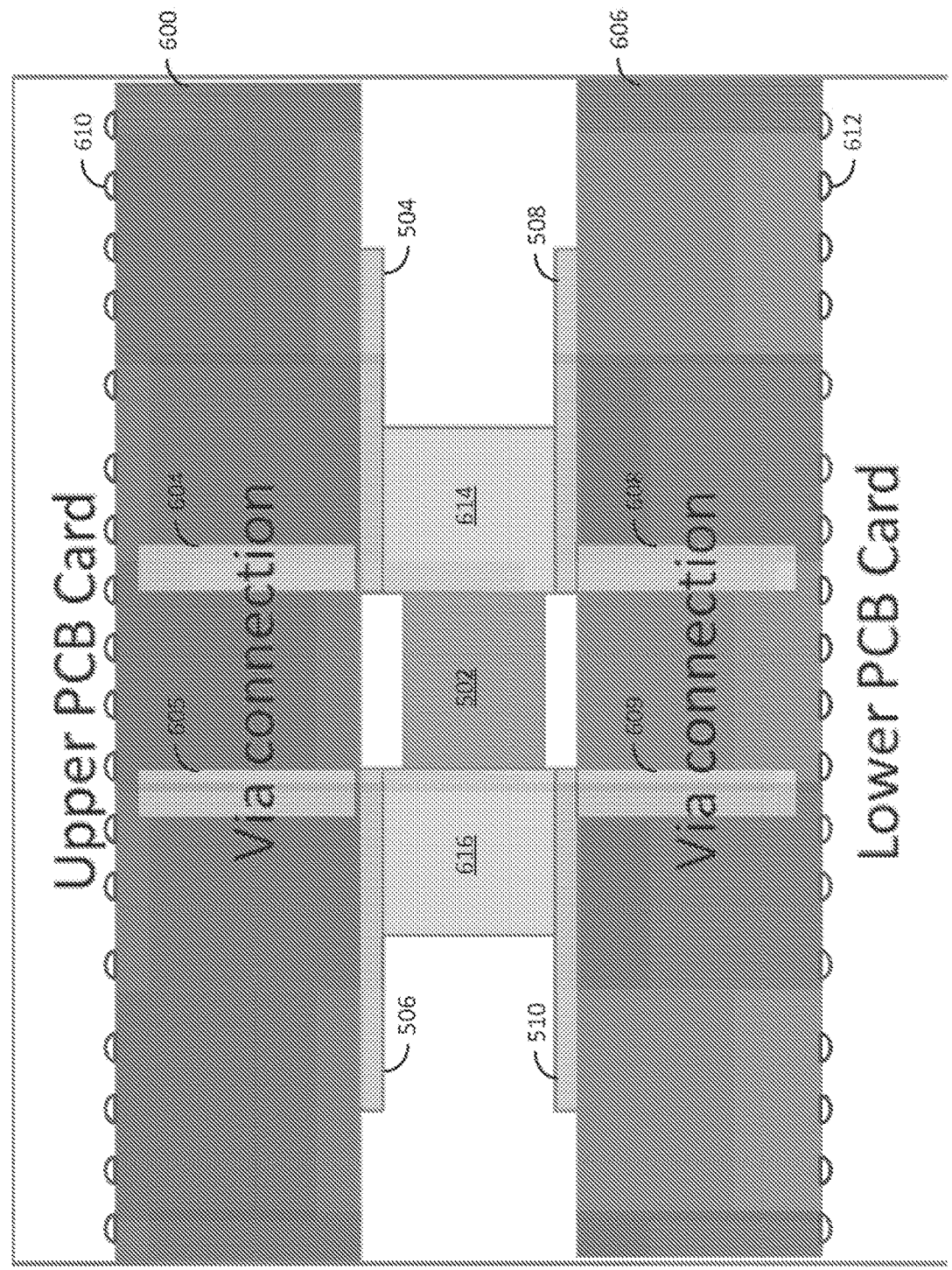
FIG. 6 is a sectional side view of a portion of a stacked Printed Circuit Board (PCB) capacitor array structure according to the present disclosure.

FIG. 6 is a sectional side view of a portion of a stacked Printed Circuit Board (PCB) capacitor array structure according to the present disclosure. The section of FIG. 6 shows a single capacitor 502 that is sandwiched between upper PCB 600 and lower PCB 606. The PCBs 606 and 600 can be referred to as a first PCB and a second PCB. The PCBs 606 and 600 can implement PCBs associated with a VRM. For example, the PCBs 606 and 600 can be implemented in place of the capacitor circuit boards 216 and 218 of FIG. 2 in certain applications. The capacitor 502 has a first side 614 that electrically couples to upper PCB 600 via conductive strip 504 and electrically couples to lower PCB 606 via conductive strip 508. The capacitor 502 has a second side 616 that electrically couples to upper PCB 600 via conductive strip 506 and electrically couples to lower PCB 606 via conductive strip 510. Upper PCB 600 includes vias 604 and 605 that couple the first side 614 and the second side 616 of the capacitor 502 to a ball grid array 610 and/or to other components. Lower PCB 606 includes vias 608 and 609 that couple the first side 614 and the second side 616 of the capacitor 502 to a ball grid array 612 and/or to other components.

Figure 7:
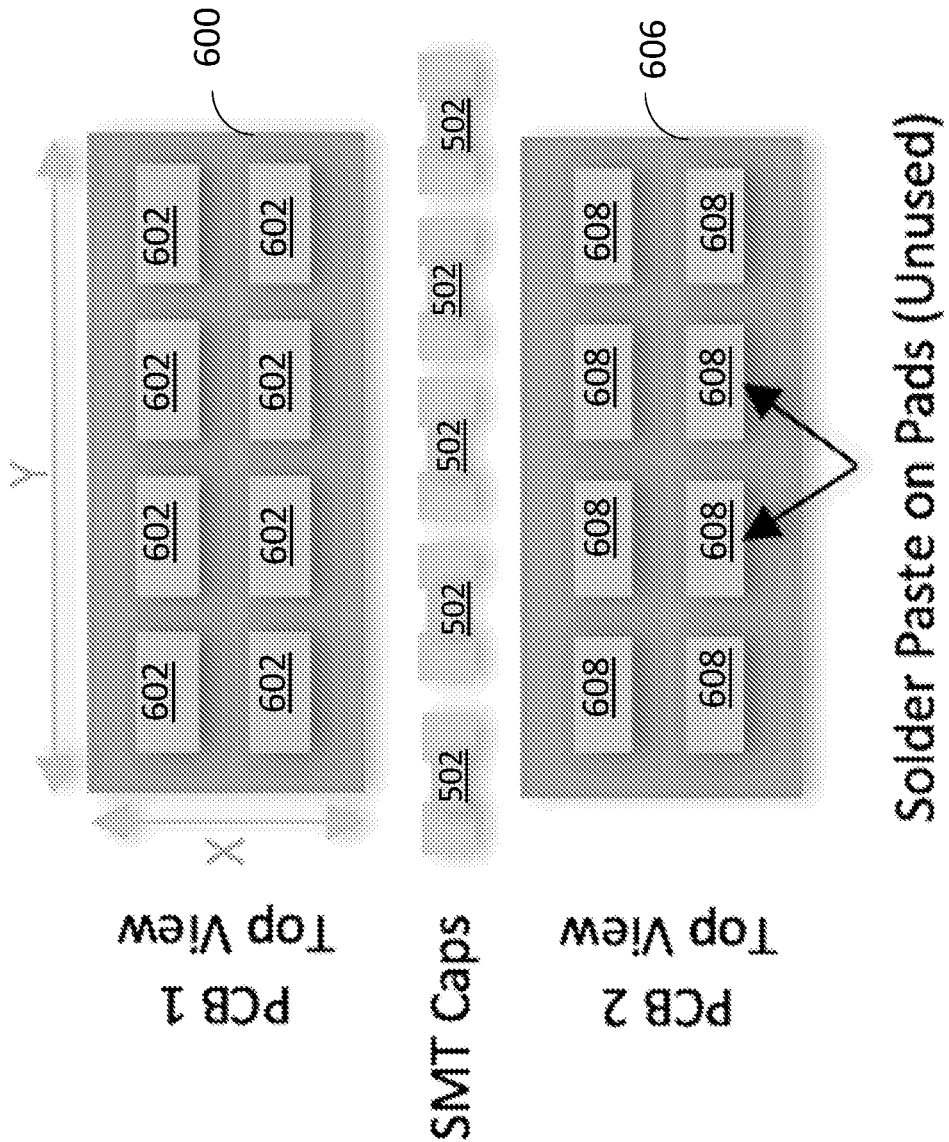
FIG. 7 is a top view of an unassembled stacked PCB capacitor array structure according to the present disclosure.

FIG. 7 is a top view of an unassembled stacked PCB capacitor array structure according to the present disclosure. The stacked capacitor array structure includes the lower PCB 600, the upper PCB 606, and a capacitor array having a plurality of capacitors 502 that will reside between the lower PCB 600 and the upper PCB 606 and electrically coupled to both the upper PCB 600 and the lower PCB 606 when construction is completed. The stacked PCB capacitor array structure includes a first plurality of solder connections electrically coupling the plurality of capacitors of the capacitor array to the upper PCB and a second plurality of solder connections electrically coupling the plurality of capacitors of the capacitor array to the lower PCB. Prior to assembly/construction, the first plurality of solder connections is an array of first solder paste pads 602 and the second plurality of solder connections is an array of second solder paste pads 608.

FIG. 8A is a sectional side view of constructed stacked PCB capacitor array structure according to the present disclosure. FIG. 8B is a top view of a partially constructed stacked PCB capacitor array structure according to the present disclosure. Referring to both FIGS. 8A and 8B, the plurality of capacitors 502 electrically couple to both the upper PCB 600 via the first plurality of solder connections 602 and the lower PCB 606 via the second plurality of solder connections 608. Ball grid arrays 610 and 612 provide electrical connection paths to the stacked PCB capacitor array. As shown in FIG. 8A, first sides of the plurality of capacitors 502 electrically couple to both the upper PCB 600 and the lower PCB 606 while second sides of the plurality of capacitors 502 electrically couple to both the upper PCB 600 and the lower PCB 606. Further, as shown in FIG. 8A, an inner surface of the upper PCB 606 couples to the plurality of capacitors 502 of the capacitor array and an inner surface of the lower PCB 606 couples to the plurality of capacitors 502 of the capacitor array. With the structure of FIGS. 8A and 8B, the capacitors 502 include a first group of capacitors that couple in series with one another and a second group of capacitors that couple in series with one another.

Figure 9A:
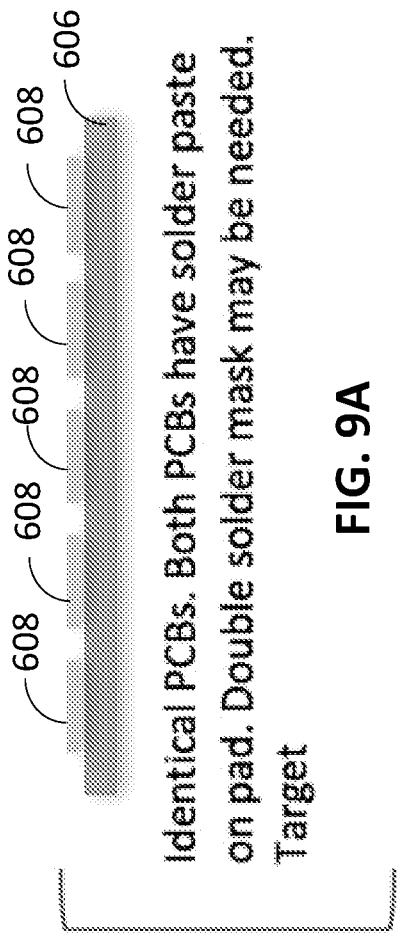
FIG. 9A is a sectional side view of a lower PCB having a first solder paste array formed thereon that includes a plurality of first solder paste pads.

FIG. 9A is a sectional side view of a lower PCB 606 having a first solder paste array formed thereon that includes a plurality of first solder paste pads 608. With some embodiments, a double solder mask (or higher order solder mask) may be utilized to compensate for differing thickness of capacitors of the capacitor array. As will be appreciated the capacitor array has a large number of capacitors and, in some embodiments, will have capacitors of differing sizes and values. Thus, when differing capacitors of the capacitor array have differing thicknesses, differing thicknesses of solder paste pads 608 may be utilized. A same structure may be used with the upper PCB 600 but with differences to reflect a differing configuration of the capacitor array from the upper side.

Figure 9B:
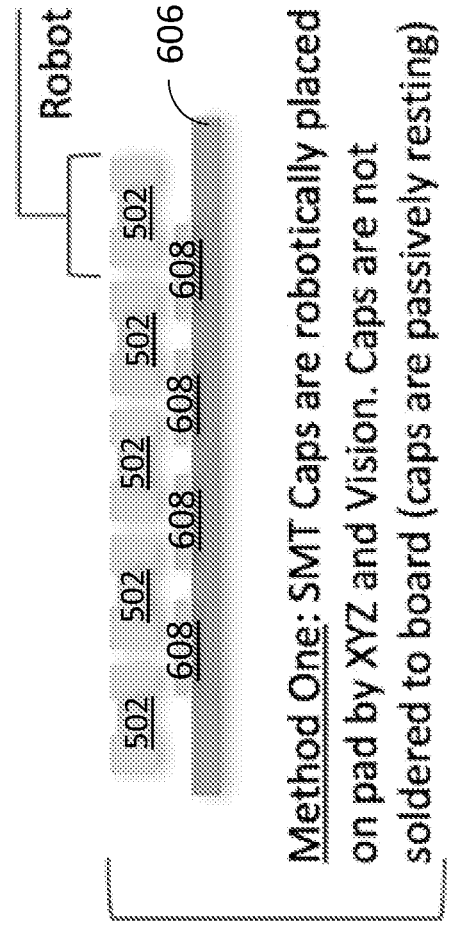
FIG. 9B is a sectional side view of the lower PCB of FIG. 9A during mounting of capacitors thereon according to the present disclosure.

FIG. 9B is a sectional side view of the lower PCB of FIG. 9A during mounting of capacitors thereon according to the present disclosure. A robot may be used to place the capacitors 502 of the capacitor array upon the first solder paste array using XYZ position and vision. At this point, in construction, the capacitors 502 are resting on the first solder paste array but not fused thereto. Thus, there should be enough friction between the solder paste pads 608 and the capacitors 502 to prevent relative motion there between during construction.

Figure 10A:
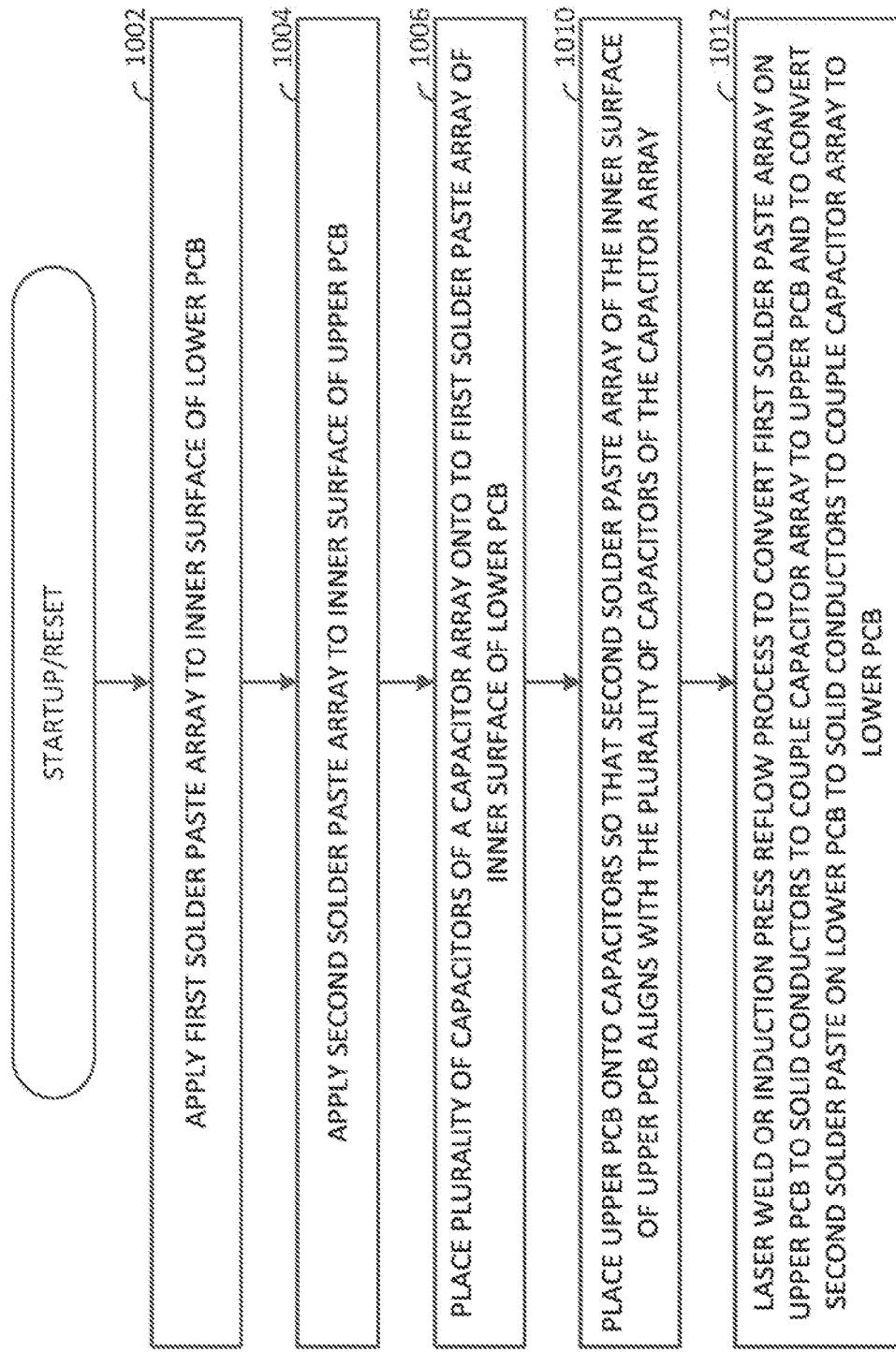
FIG. 10A is a flow diagram illustrating a first embodiment for constructing a stacked PCB capacitor array structure according to the present disclosure.

FIG. 10A is a flow diagram illustrating a first embodiment for constructing a stacked PCB capacitor array structure according to the present disclosure. FIGS. 10B and 10C are sectional side views of the stacked PCB capacitor array structure during construction consistent with FIG. 10A. Referring jointly to FIGS. 10A, 10B, and 10C, a method 1000 for constructing a stacked PCB capacitor array includes applying a first solder paste array having a plurality of first solder paste pads 608 to an inner surface of a lower PCB 606 (step 1002). The method 1000 continues with applying a second solder paste array having a plurality of second solder paste pads to an inner surface of an upper PCB 600 (step 1004). The method 1000 continues with placing a plurality of capacitors 502 of a capacitor array onto the first solder paste array of the lower PCB 606, wherein a pattern of the first solder paste array corresponds to the capacitor array (step 1006). The method 1000 continues with placing the upper PCB 600 onto the capacitor array so that the second solder paste array of the upper PCB 600 aligns with the plurality of capacitors of the capacitor array (step 1010). The method 1000 continues with applying heat to convert the first solder paste array and the second solder paste array to solid conductors 1014 and 1016, respectively (step 1012). An induction press reflow process or laser welding may be used to convert the first solder paste array on the upper PCB 600 to solid conductors to couple the capacitor array to the upper PCB 600 and to convert the second solder paste on the lower PCB 606 to solid conductors to couple the capacitor array to the lower PCB 606.

Figure 11A:
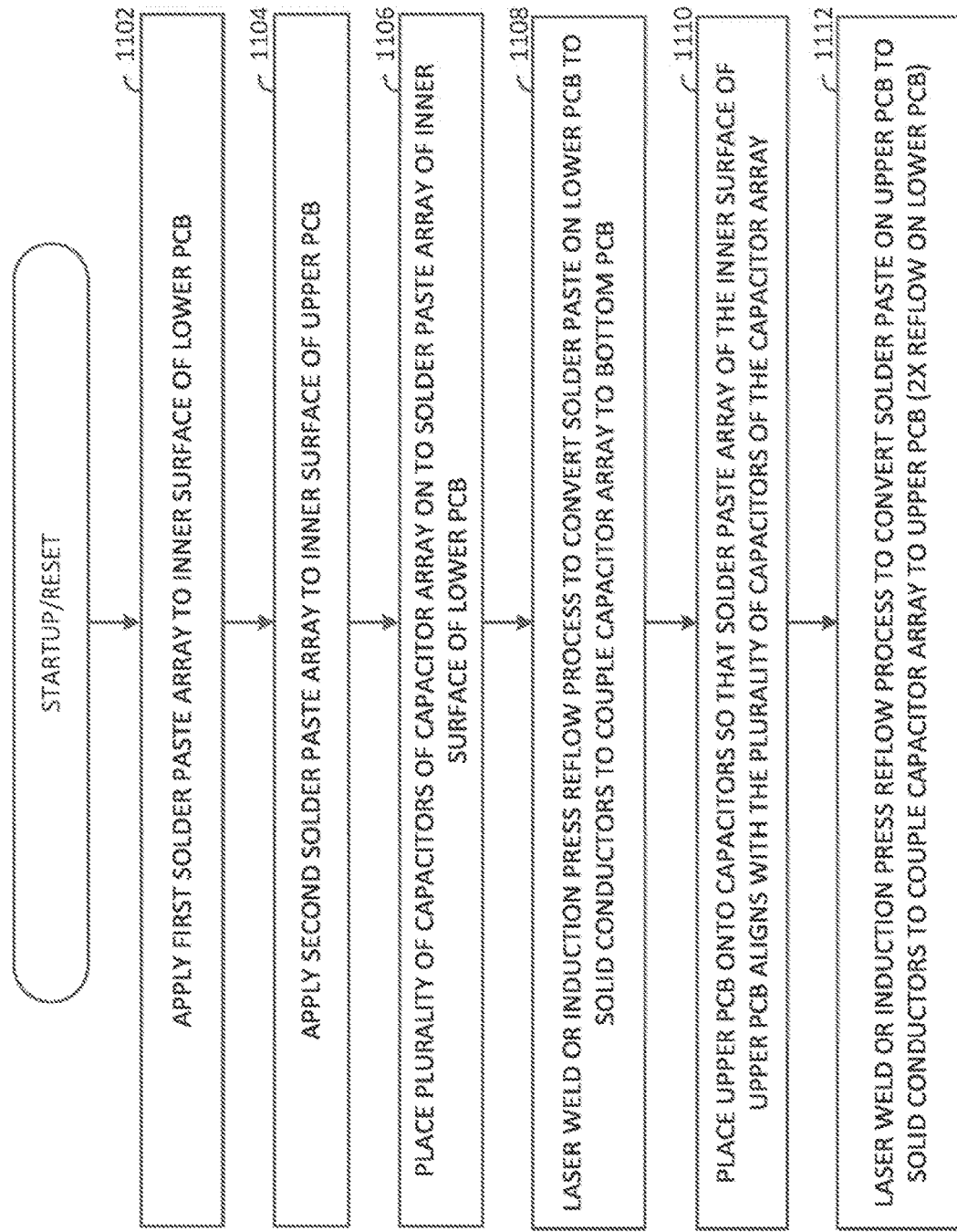
FIG. 11A is a flow diagram illustrating a second embodiment for constructing a stacked PCB capacitor array structure according to the present disclosure.
Figure 11B:
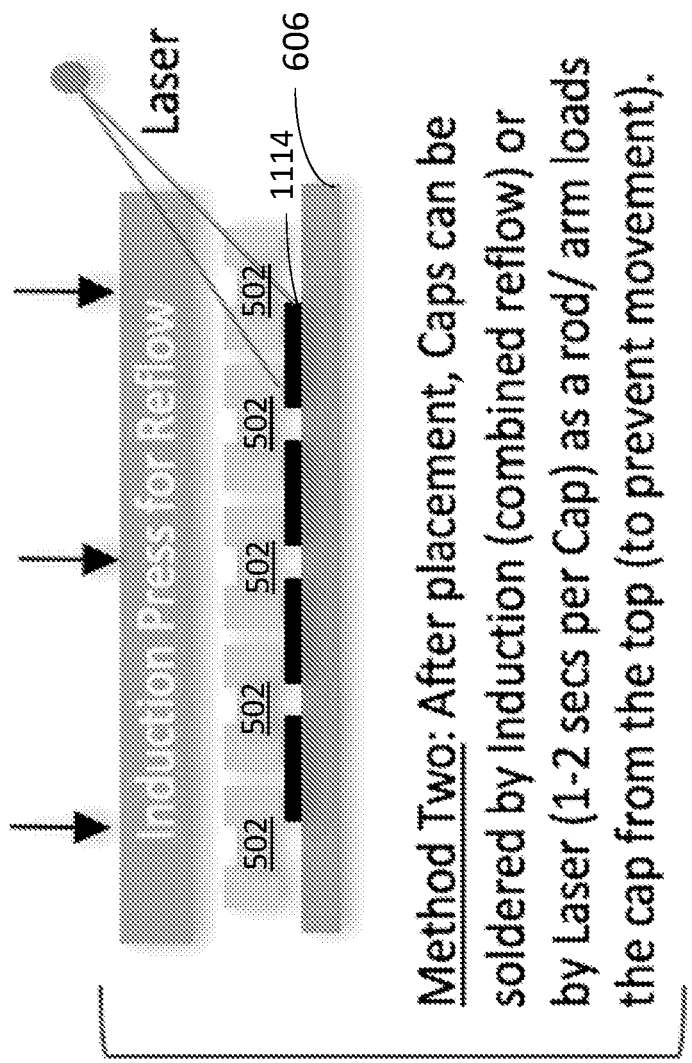

FIG. 11A is a flow diagram illustrating a second embodiment for constructing a stacked PCB capacitor array structure according to the present disclosure. FIGS. 11B, 11C, and 11D are sectional side views of the stacked PCB capacitor array structure during construction consistent with FIG. 11A. Referring to all of FIGS. 11A, 11B, 11C and 11D, a method 1100 for constructing a stacked PCB capacitor array includes applying a first solder paste array having a plurality of first solder paste pads 608 to an inner surface of a lower PCB 606 (step 1102). The method 1100 continues with applying a second solder paste array having a plurality of second solder paste pads to an inner surface of an upper PCB 600 (step 1104). The method 1100 continues with placing a plurality of capacitors 502 of a capacitor array onto the first solder paste array of the lower PCB 606, wherein a pattern of the first solder paste array corresponds to the capacitor array (step 1006). The method 1100 continues with applying heat to convert the first solder paste array to solid conductors 1114 (step 1008). The method 1100 continues with placing the upper PCB 600 onto the capacitor array so that the second solder paste array of the upper PCB 600 aligns with the plurality of capacitors of the capacitor array (step 1010). The method 1100 continues with applying heat to convert the second solder paste array to solid conductors 1116 (step 1012). An induction press reflow process or laser welding may be used to convert the solder paste on the upper PCB 600 to solid conductors to couple the capacitor array to the upper PCB 600 and to convert the solder paste on the lower PCB 606 to solid conductors to couple the capacitor array to the lower PCB 606. Note that the solid conductors 1114 have been through two reflow processes at step 1012.

While the description and diagrams herein may relate to components residing between the upper and lower PCBs being discrete capacitors, these components could be different (passive and/or active) components. For example, the components could be an array of discrete inductors, or an array of both discrete inductors and discrete capacitors. Further, these components could be packaged components, e.g., a package including multiple capacitors, multiple inductors, a combination of capacitors and inductors, a combination of capacitors, inductors, and resistors, etc. In some applications, the electronic components can include active components, such as integrated circuit chips. Such integrated circuit chips can include transistors. Any suitable electronic components can be positioned between PCBs in accordance with any suitable principles and advantages disclosed herein. For example, any suitable combination of features discussed with reference to FIGS. 5 to 11D can be implemented in association with any suitable electronic components in place of discrete capacitors. Although embodiments disclosed herein may relate to capacitors positioned between two PCBs, any suitable principles and advantages disclosed herein can be applied to arrays of electronic components positioned between various groups of two PCBs from a stack of three or more PCBs.

The systems and methods above has been described in general terms as an aid to understanding details of preferred embodiments of the disclosure. Other preferred embodiments of the present disclosure include the described application for electric vehicles. In the description herein, numerous specific details are provided, such as examples of components and/or methods, to provide a thorough understanding of embodiments disclosed herein. One skilled in the relevant art will recognize, however, that an embodiment can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments disclosed herein.

Reference throughout this specification to "one embodiment", "an embodiment", or "a specific embodiment" means that a particular feature, structure, or characteristic described in connection with the embodiment is included in at least one embodiment of the present disclosure and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present disclosure may be combined in any suitable manner with one or more other embodiments. It is to be understood that other variations and modifications of the embodiments of the present disclosure described and illustrated herein are possible in light of the teachings herein and are to be considered as part of the spirit and scope of the present disclosure.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present disclosure, including what is described in the Abstract, is not intended to be exhaustive or to limit the inventions to the precise forms disclosed herein. While specific embodiments of, and examples for, the innovations are described herein for illustrative purposes only, various equivalent modifications are possible within the spirit and scope of the present disclosure, as those skilled in the relevant art will recognize and appreciate. As indicated, these modifications may be made to the disclosed embodiments in light of the foregoing description of illustrated embodiments and are to be included within the spirit and scope of the present disclosure.

Thus, while the present disclosure has been described herein with reference to particular embodiments thereof, a latitude of modification, various changes and substitutions are intended in the foregoing disclosures, and it will be appreciated that in some instances some features of embodiments will be employed without a corresponding use of other features without departing from the scope and spirit of the disclosure as set forth. Therefore, many modifications may be made to adapt a particular situation or material to the essential scope and spirit of the present disclosure. It is intended that the disclosure not be limited to the particular terms used in following claims and/or to the particular embodiment disclosed as the best mode contemplated for carrying out the inventions, but that the inventions will include any and all embodiments and equivalents falling within the scope of the appended claims. Thus, the scope of the inventions is to be determined by the appended claims.

What is claimed is:

1. A stacked Printed Circuit Board (PCB) electronic component array structure comprising:
    a first PCB;
    a second PCB, the second PCB being stacked with the first PCB; and
    an electronic component array comprising a plurality of electronic components positioned between the first PCB and the second PCB, the electronic component array comprising a plurality of capacitors, the plurality of electronic components being electrically coupled to the first PCB by way of a first conductive strip connections and being electrically coupled to the second PCB by way of second conductive strip connections, wherein a first conductive strip connection of the first conductive strip connections provides a shared electrical connection between a group of capacitors of the plurality of capacitors and the first PCB.

2. The stacked PCB electronic component array structure of claim 1, wherein:
    first sides of the plurality of electronic components electrically couple to both the first PCB and the second PCB; and
    second sides of the plurality of electronic components electrically couple to both the first PCB and the second PCB.

3. The stacked PCB capacitor array structure of claim 2, wherein:
    an inner surface of the first PCB couples to the plurality of electronic components of the electronic components array; and
    an inner surface of the first PCB couples to the plurality of electronic components of the electronic components array.

4. The stacked PCB capacitor array structure of claim 2, further comprising:
    a first ball grid array disposed on an outer surface of the first PCB, the plurality of electronic components being electrically coupled to the first ball grid array by way of first vias in the first PCB; and
    a second ball grid array disposed on an outer surface of the second PCB, the plurality of electronic components being electrically coupled to second first ball grid array by way of second vias in the second PCB.

5. The stacked PCB electronic component array structure of claim 1, wherein the group of capacitors is electrically connected in parallel with each other, and the plurality of capacitors comprise a second group of capacitors electrically connected in series with each other.

6. The stacked PCB electronic component array structure of claim 1, wherein the stacked PCB electronic component array is implemented in a voltage regulator module (VRM).

7. The stacked PCB electronic component array structure of claim 1, wherein a second conductive strip connection of the second conductive strip connections electrically connects the group of electronic components of the plurality of capacitors to the second PCB.

8. A stacked Printed Circuit Board (PCB) electronic component array structure comprising:
    a first PCB;
    a second PCB, the second PCB being stacked with the first PCB; and
    a two-dimensional electronic component array comprising a plurality of electronic components positioned between the first PCB and the second PCB, the plurality of electronic components being electrically coupled to the first PCB by way of first solder connections and being electrically coupled to the second PCB by way of second solder connections, wherein a first common solder connection of the first solder connections electrically connects a group of electronic components of the plurality of electronic components to the first PCB, and wherein a second common solder connection of the second solder connections electrically connects the group of electronic components of the plurality of electronic components to the second PCB.

9. The stacked PCB electronic component array structure of claim 8, wherein the plurality of electronic components are capacitors.

10. The stacked PCB electronic component array structure of claim 9, wherein the stacked PCB electronic component array is implemented in a voltage regulator module (VRM) that is configured to receive a voltage and convert the voltage to a lower voltage.

11. The stacked PCB electronic component array structure of claim 8, wherein a third common solder connection of the first solder connections electrically connects a second group of electronic components of the plurality of electronic components to the first PCB, and wherein a fourth common solder connection of the second solder connections electrically connects the second group of electronic components of the plurality of electronic components to the second PCB.

12. A voltage regulator module comprising:
a first printed circuit board (PCB);
a second PCB, the second PCB being stacked with the first PCB; and
a two-dimensional capacitor array positioned between the first PCB and the second PCB, wherein a first common solder connection electrically connects a group of capacitors of the two-dimensional capacitor array to the first PCB,
wherein the voltage regulator module is configured to receive a voltage and convert the voltage to a lower voltage.

13. The voltage regulator module of claim 12, wherein a second common solder connection electrically connects the group of capacitors of the two-dimensional capacitor array to the second PCB.

14. The voltage regulator module of claim 12, wherein a second common solder connection electrically connects a second group of capacitors of the two-dimensional capacitor array to the first PCB.

15. The voltage regulator module of claim 12, wherein the capacitors of the group are connected in series with each other.

16. The voltage regulator module of claim 12, wherein the voltage is in a range from 40 Volts to 60 Volts.

17. The voltage regulator module of claim 16, wherein the lower voltage is less than 1 Volt.

18. The voltage regulator module of claim 12, wherein the voltage regulator module outputs over 100 Amperes of current.

\* \* \* \* \*